United States Patent [19]

Van Antwerp, Jr. et al.

[11] Patent Number: 6,138,058

[45] Date of Patent: Oct. 24, 2000

[54] METHOD FOR ELECTRONICALLY TRACKING CONTAINERS TO AVOID MISPROCESSING OF CONTENTS

[75] Inventors: Kenneth D. Van Antwerp, Jr., Colorado Springs; Bedford E. Hardee, Woodland Park; Dennis L. Myers, Colorado Springs, all of Colo.

[73] Assignee: Jenoptik Infab, Inc., Colorado Springs, Colo.

[21] Appl. No.: 09/003,542

[22] Filed: Jan. 6, 1998

[51] Int. Cl.[7] .................................................. G06F 17/00
[52] U.S. Cl. .................... 700/225; 700/215; 340/825.54; 340/572
[58] Field of Search .................................. 700/225, 215, 700/221, 222, 229; 340/825, 54, 572, 505, 568, 825.49

[56] References Cited

U.S. PATENT DOCUMENTS

| | | |
|---|---|---|
| 3,745,569 | 7/1973 | Works et al. . |
| 3,812,328 | 5/1974 | Tramposch . |
| 3,852,755 | 12/1974 | Works et al. . |
| 4,068,232 | 1/1978 | Meyers et al. . |
| 4,570,058 | 2/1986 | Havassy . |
| 4,600,630 | 7/1986 | Quinn et al. . |
| 4,611,380 | 9/1986 | Abe et al. . |
| 4,636,634 | 1/1987 | Harper et al. ............................ 250/223 |
| 4,642,017 | 2/1987 | Fenn . |
| 4,656,463 | 4/1987 | Anders et al. . |
| 4,670,295 | 6/1987 | Quinn et al. . |
| 4,724,427 | 2/1988 | Carroll . |
| 4,734,698 | 3/1988 | Nysen et al. . |
| 4,775,786 | 10/1988 | Yamano et al. . |
| 4,786,907 | 11/1988 | Koelle . |
| 4,814,742 | 3/1989 | Morita et al. . |
| 4,827,110 | 5/1989 | Rossi et al. . |
| 4,827,395 | 5/1989 | Anders et al. . |
| 4,833,306 | 5/1989 | Milbrett . |
| 4,837,568 | 6/1989 | Snaper . |
| 4,843,640 | 6/1989 | Juengel . |
| 4,857,893 | 8/1989 | Carroll . |
| 4,862,160 | 8/1989 | Ekchian et al. . |
| 4,888,473 | 12/1989 | Rossi et al. . |
| 4,941,201 | 7/1990 | Davis . |
| 4,962,466 | 10/1990 | Revesz et al. . |
| 4,974,166 | 11/1990 | Maney et al. ............................ 364/478 |
| 4,990,892 | 2/1991 | Guest et al. . |
| 5,005,125 | 4/1991 | Farrar et al. . |
| 5,050,106 | 9/1991 | Yamamoto et al. ..................... 364/550 |
| 5,097,421 | 3/1992 | Maney et al. . |
| 5,119,104 | 6/1992 | Heller . |
| 5,146,207 | 9/1992 | Henry et al. . |
| 5,153,842 | 10/1992 | Dlugos, Sr. et al. . |
| 5,204,986 | 4/1993 | Ito et al. . |
| 5,262,885 | 11/1993 | Steers et al. . |
| 5,266,925 | 11/1993 | Vercellotti et al. . |
| 5,276,496 | 1/1994 | Heller et al. . |
| 5,327,115 | 7/1994 | Swierczek . |
| 5,339,074 | 8/1994 | Shindley et al. . |
| 5,387,993 | 2/1995 | Heller et al. . |
| 5,389,769 | 2/1995 | Yamashita ............................... 235/375 |
| 5,572,195 | 11/1996 | Heller et al. . |
| 5,742,238 | 4/1998 | Fox . |
| 5,768,140 | 6/1998 | Swartz et al. ....................... 364/478.13 |
| 5,774,876 | 6/1998 | Wooley et al. ............................ 705/28 |
| 5,887,176 | 3/1999 | Griffith et al. ........................... 395/750 |

*Primary Examiner*—Christopher P. Ellis
*Assistant Examiner*—Khoi H. Tran
*Attorney, Agent, or Firm*—Nikolai, Mersereau & Dietz, P.A.

[57] ABSTRACT

An apparatus for tracking items in a factory is disclosed. The apparatus is partially well suited for manufacturing environments wherein there are a plurality of items to be kept together in groups. The invention is particularly useful in semiconductor processing facilities wherein batches of semiconductor wafers to be processed are placed in wafer carriers which are, in turn, placed in work-in-progress boxes. Applying identification tags to one item that can be read and processed by a microterminal attached to the other item provides an effective way to prevent improper grouping of the items which can lead to misprocessing or handling of the batches of wafers.

28 Claims, 11 Drawing Sheets

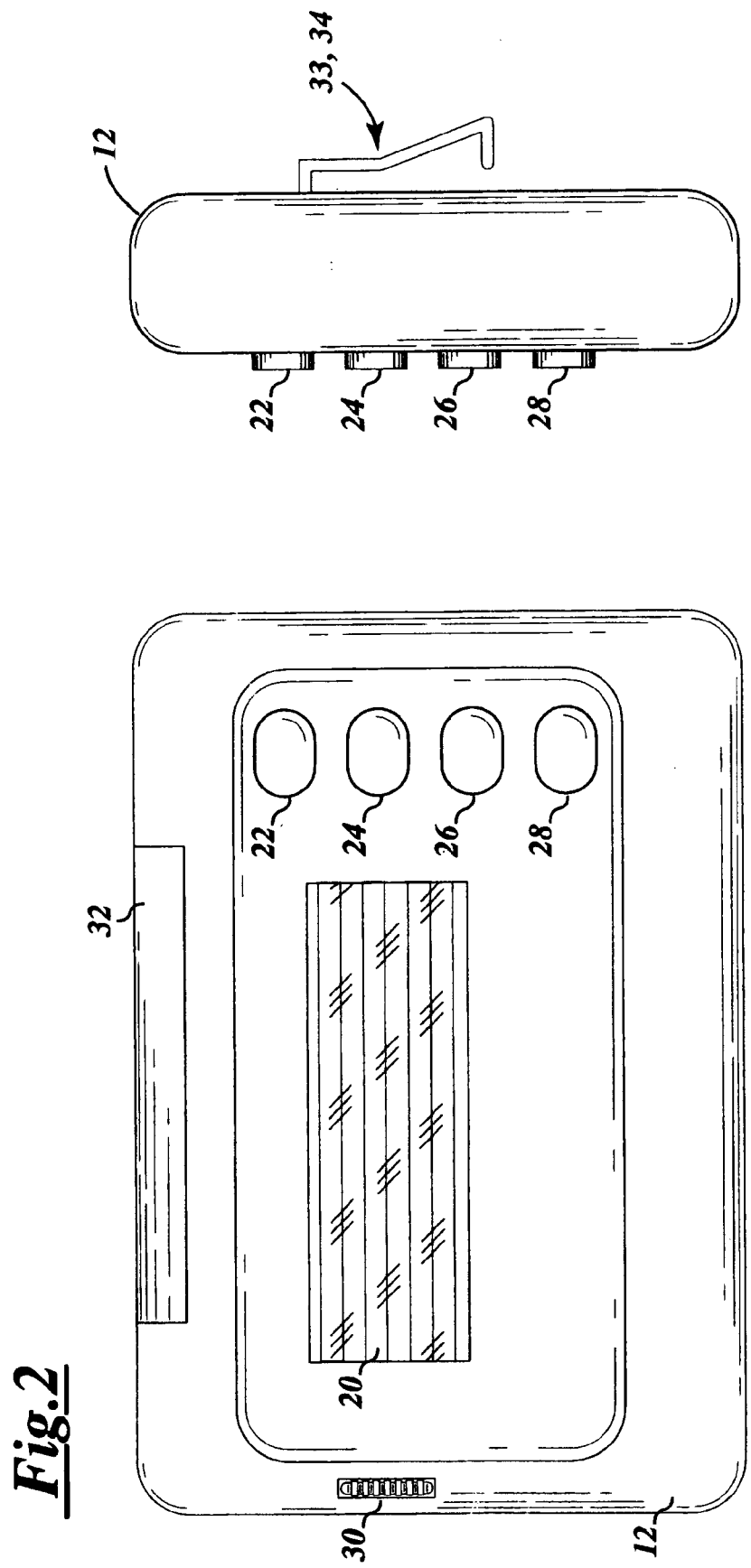

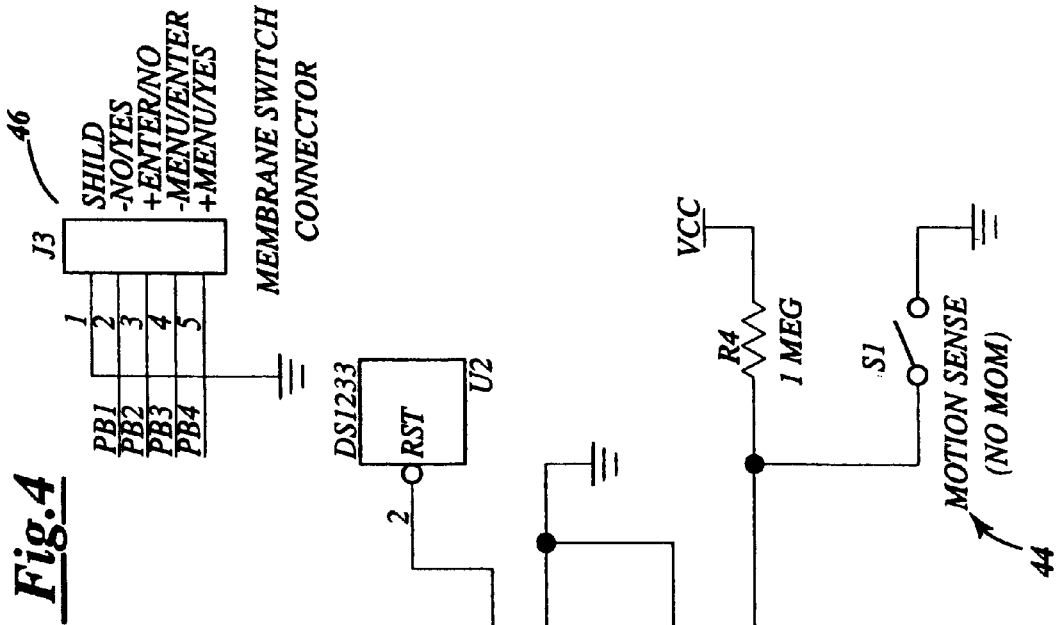
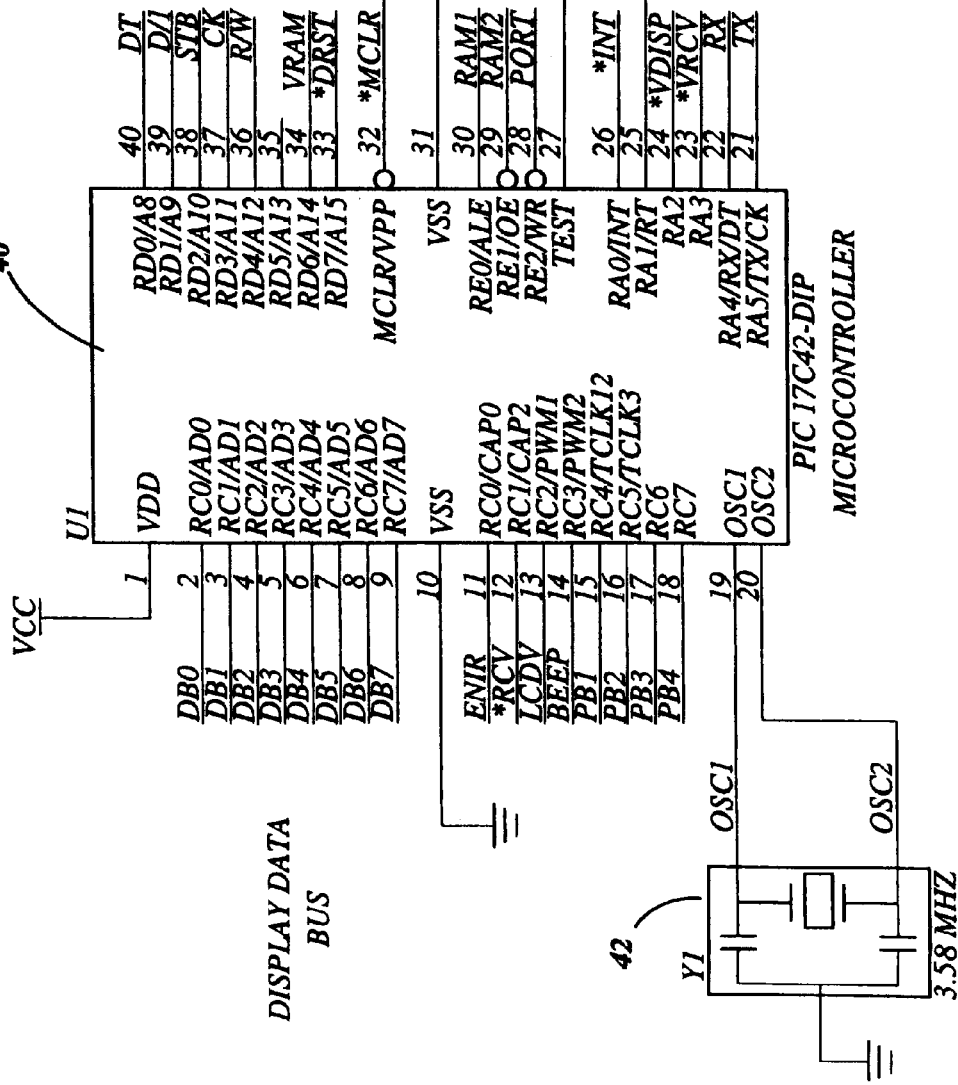

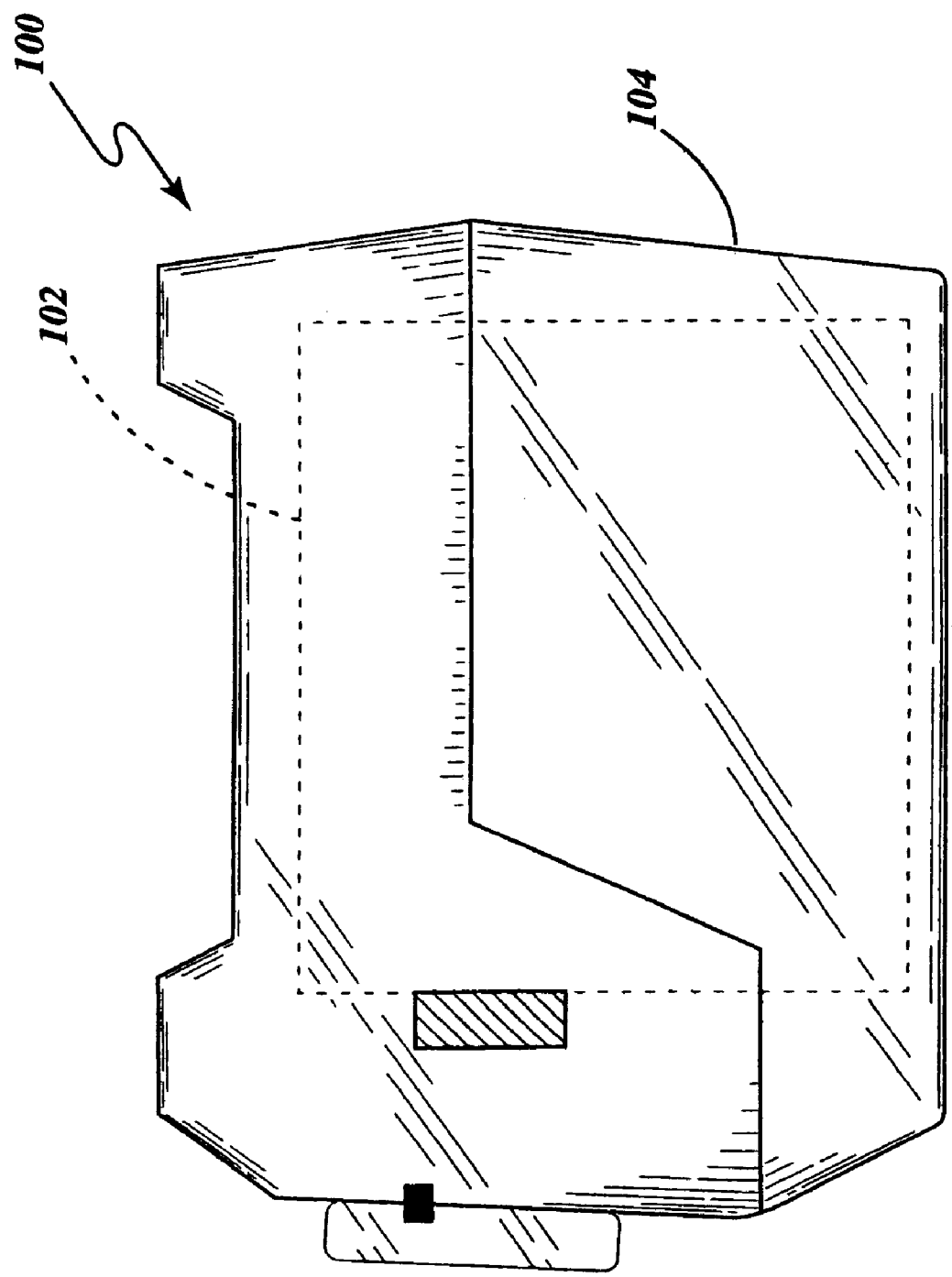

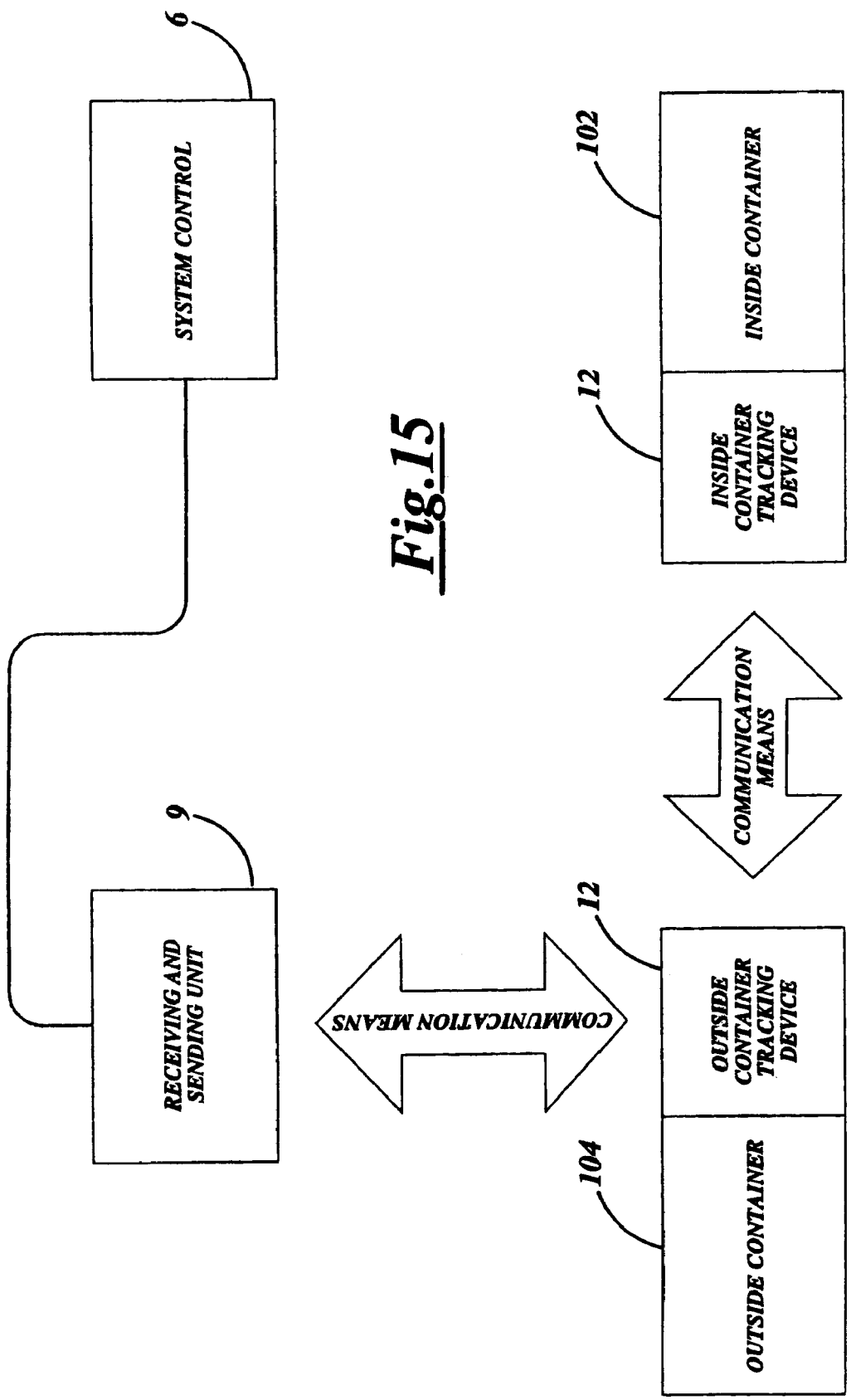

METHOD FOR ELECTRONICALLY TRACKING CONTAINERS TO AVOID MISPROCESSING OF CONTENTS

BACKGROUND OF THE INVENTION

Summary of the Invention

The present invention relates to a system for providing wireless communication between various items located in a factory. More specifically, the system provides both the function of tracking the location of items equipped with microterminals and also provides the function of providing direct communication between microterminals and between a central controller and microterminal.

The apparatus of the present invention is particularly suitable for use in semiconductor manufacturing facilities. In such facilities, wafer carriers and work-in-progress (WIP) boxes are used to transport semiconductor wafers from one work location to another. Each wafer carrier in the factory is typically paired with the WIP box which is designed to contain the wafer carrier and its contents to prevent contamination of the semiconductor wafers. In one embodiment, the apparatus includes a microterminal attached to the WIP box and a microterminal attached to the wafer carrier. In other embodiments, a microterminal is attached to either the wafer carrier or the WIP box and an identification tag is attached to the other of the WIP box or the carrier. The identification tag could be in the form, for example, of a bar code label or in the form of an electronic tag. In either event, the microterminal must be equipped in such a way that it can "read" the data of the tag. In any of these embodiments, there is communication of identification information to at least one microterminal for purposes of establishing and verifying that the proper wafer carrier is located within the proper WIP box.

In addition to the basic elements of the system outlined above, the system may also include a plurality of transceivers mounted strategically throughout the factory. The transceivers are hardwired to a system controller. The transceivers can then be used to communicate information between the system controller and the microterminals in the factory. The system is also designed so that the microterminals and transceivers can be used to track the location of microterminals within the factory. One system similar to the present invention is described in U.S. Pat. No. 5,742,238, which is hereby incorporated by reference. While the system described there is very suitable for tracking the location of microterminals in the factory and for providing two-way communication between the microterminals and central controller via the transceivers, that application does not disclose the exchange of identification information between microterminals and/or tags attached to a pair of containers, such as a WIP box and a wafer carrier, that are intended to work in tandem. The primary advantage contemplated by the subject invention here is to prevent misprocessing of the wafers because of inadvertent mixing of WIP boxes and wafer carriers.

A greater understanding of the present invention and its many advantages can be derived from a review of the following detailed description of the invention, the drawings contained herein, and the claims set forth below.

BRIEF DESCRIPTION OF THE DRAWINGS

FIG. 2 is a drawing showing a front and side view of the exterior of the microterminal of the present invention.

FIG. 3 is a schematic of the controller circuit of the microterminal shown in FIG. 2.

FIG. 4 is a schematic diagram of the connector used to connect the switches of the microterminal to its control circuit.

FIG. 14 is a schematic diagram showing an inner container having a microterminal attached thereto, and an outer container having an identification device attached thereto.

FIG. 15 is a block diagram showing the communication paths between the outside container tracking device, the inside container tracking device and the central controller.

DETAILED DESCRIPTION OF THE PREFERRED EMBODIMENT

Figure 1:
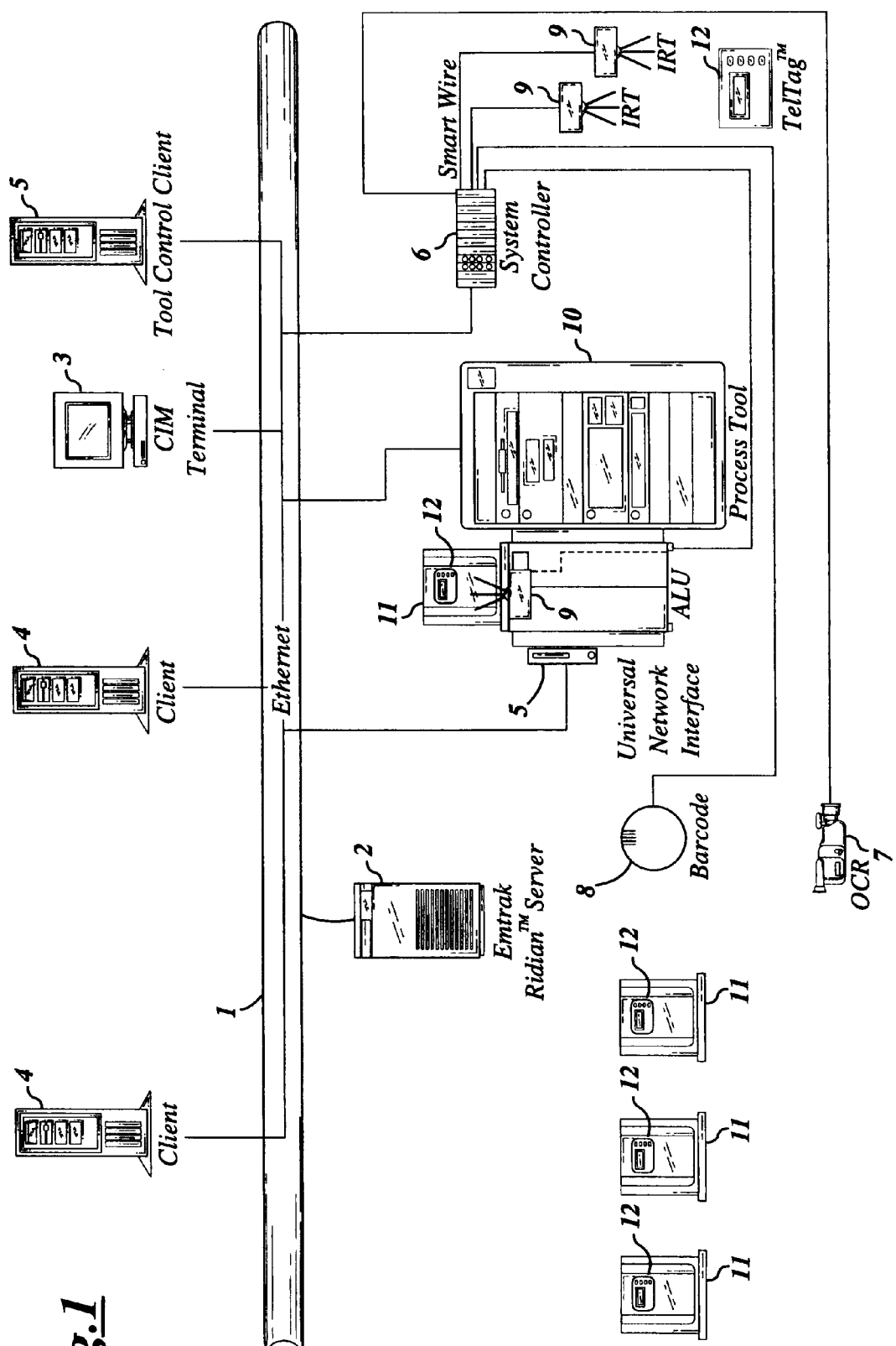
FIG. 1 is a block diagram showing the arrangement of various interconnected components of the factory communication and tracking system of the present invention.

FIG. 1 is intended to show the arrangement of various hardware components of a typical installation of the present invention. Such an installation is described in further detail in U.S. Pat. No. 5,742,238. As shown in FIG. 1, local area network 1 is established using Ethernet Ten-Base-T wiring. Attached to the local area network is a file server 2, a CIM (computer integrated manufacturing) terminal 3, a number of client application computers 4, one or more computers 5 configured to control processing equipment within the factory, and a system controller 6. Wired to the system controller 6 can be one or more optical character readers 7, one or more bar code readers 8, and a plurality of infrared transceivers (IRTs) 9. In a typical arrangement, the IRTs 9 are mounted in the ceiling of the factory or on one of the processing tools 10. The system also includes a number of microterminals 12. Given this arrangement, messages can be sent through the system controller 6 and IRTs 9 to the microterminals 12 from the server 2, any of the client applications 4 (through the server 2), or the CIM terminal 3 attached to the local area network 1 (through the server 2).

FIG. 2 shows the exterior of microterminal 12. As shown, it includes a liquid crystal display 20, four push buttons 22, 24, 26 and 28, a beeper 30, and lenses 32, 33 and 34 for the microterminal's IR light generator and detector.

The design of the microterminal 12 allows it to perform many different functions. Its primary purpose is to serve as a portable, wireless, electronic terminal, the use of which allows workers in the factory to communicate with the LAN 1. The microterminal 12 uses modulated infrared light as a communication medium and is capable of receiving and displaying text and graphic information from the LAN 1 on its display 20. The microterminal 12 is capable of transmitting information related to its identity and status as well as operator responses entered on one of four push button switches 22–28. The microterminal 12 is also capable of storing text messages and graphic images and to recall them to the display 20 on operator demand. To attract the operator's attention, the microterminal 12 can also generate audible signals using beeper 30. Still another important function of the microterminal 12 is its ability to provide location information to help operators locate, for example, a container to which the microterminal 12 is attached.

One preferred embodiment of the electronic systems of the microterminal 12 will now be discussed with reference to FIGS. 3–13. Of course, those skilled in the art will recognize that other electronic configurations can be used without deviating from the invention. As shown in FIG. 3, the microterminal 12 includes a CMOS microcontroller 40, a 3.579545 MHZ internal oscillator 42 under resonator control for accurate timing and data generation, and a motion sensor 44. The CPU also has firmware to control all functions and operations of the microterminal.

FIG. 4 shows a jack 46 to which the four membrane switches 22–28 are attached. Jack 46 provides inputs to the microterminal 40 through pins 15–18 of the microcontroller 40 (i.e., PB1–PB4) shown on the left-hand side of the microcontroller in 3.

Figure 5:
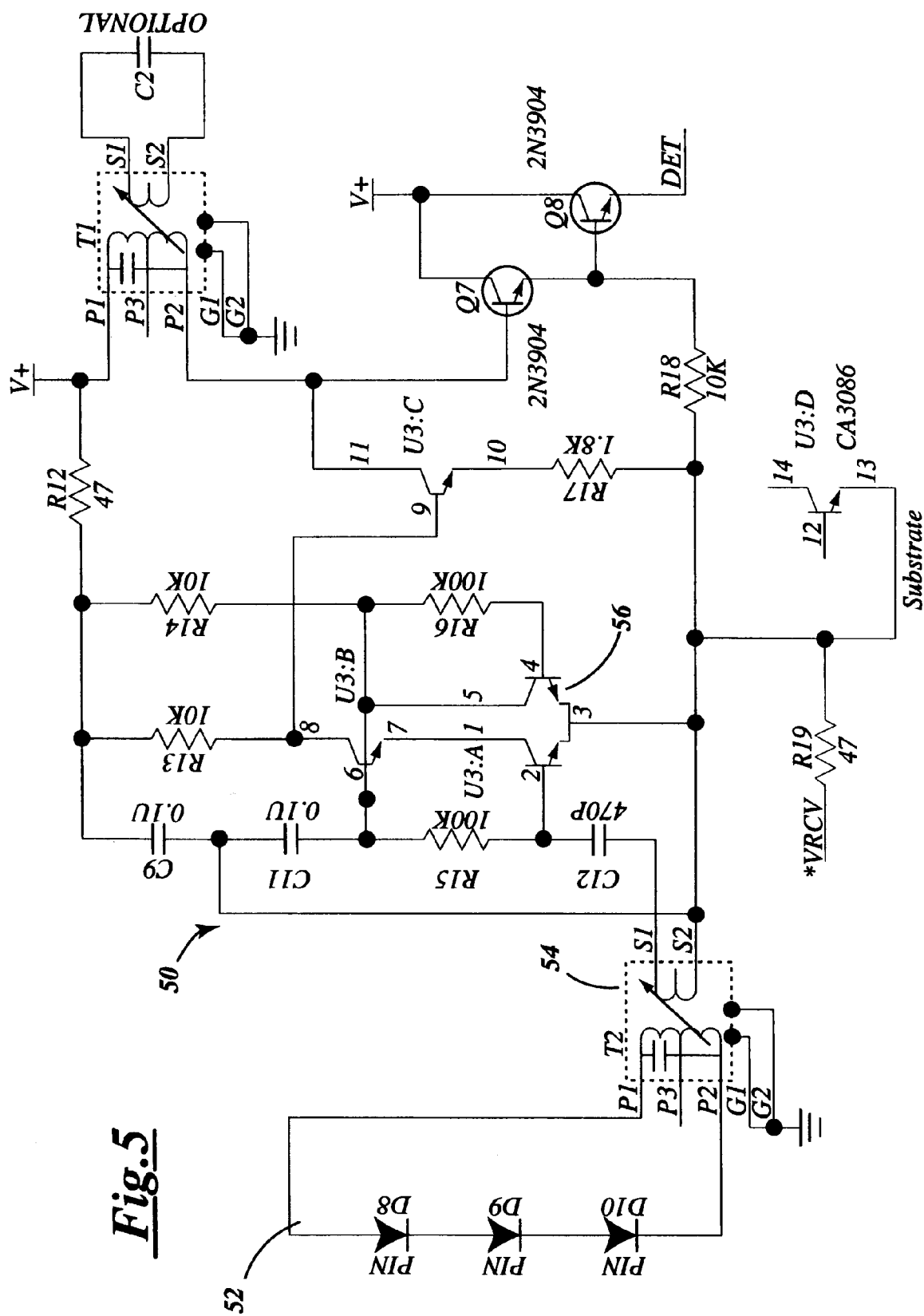
FIG. 5 is a schematic diagram of the infrared receiver of the microterminal shown in FIG. 2.
Figure 6:
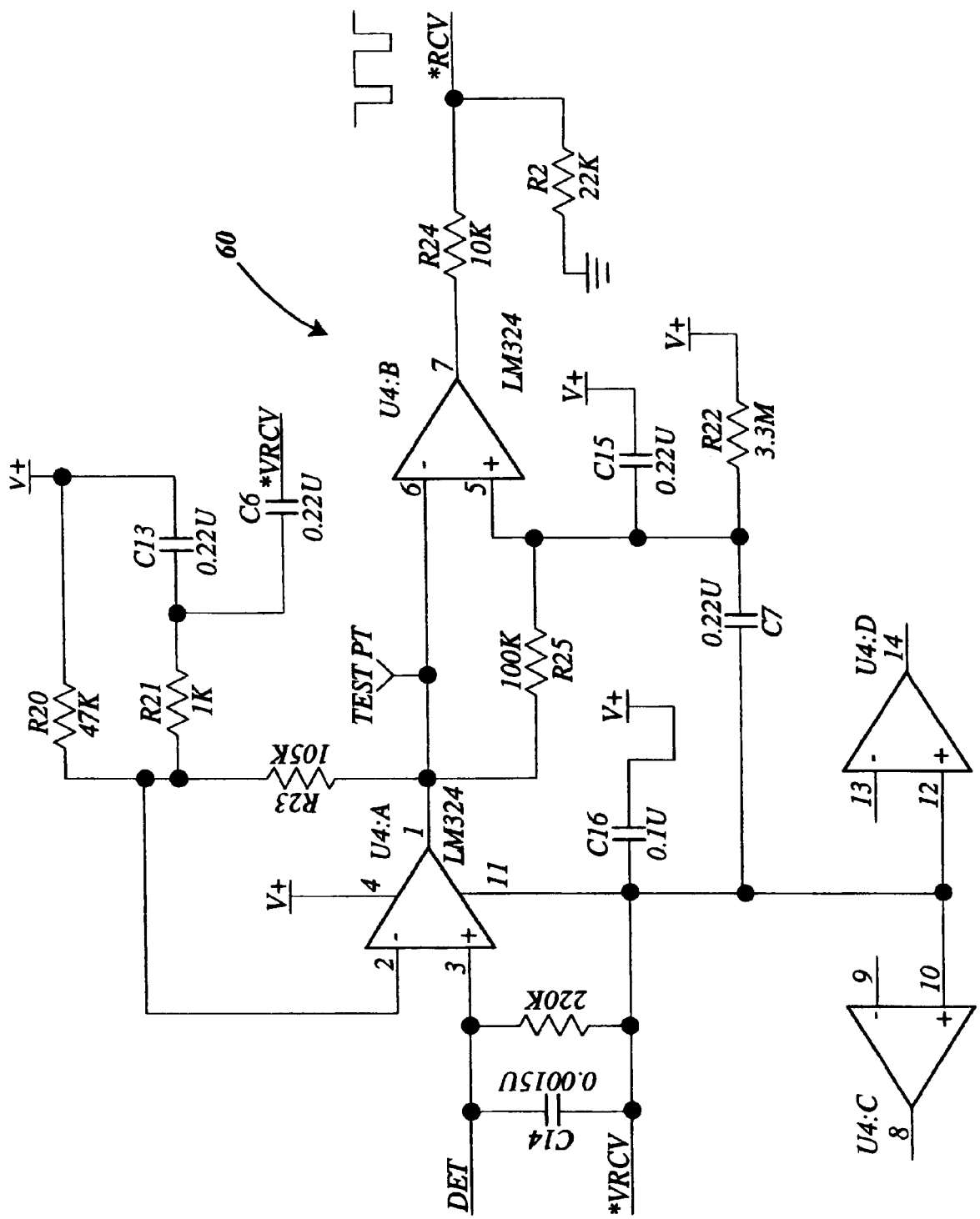
FIG. 6 is a schematic diagram of the infrared demodulator of the microterminal shown in FIG. 2.
Figures 7, 8:
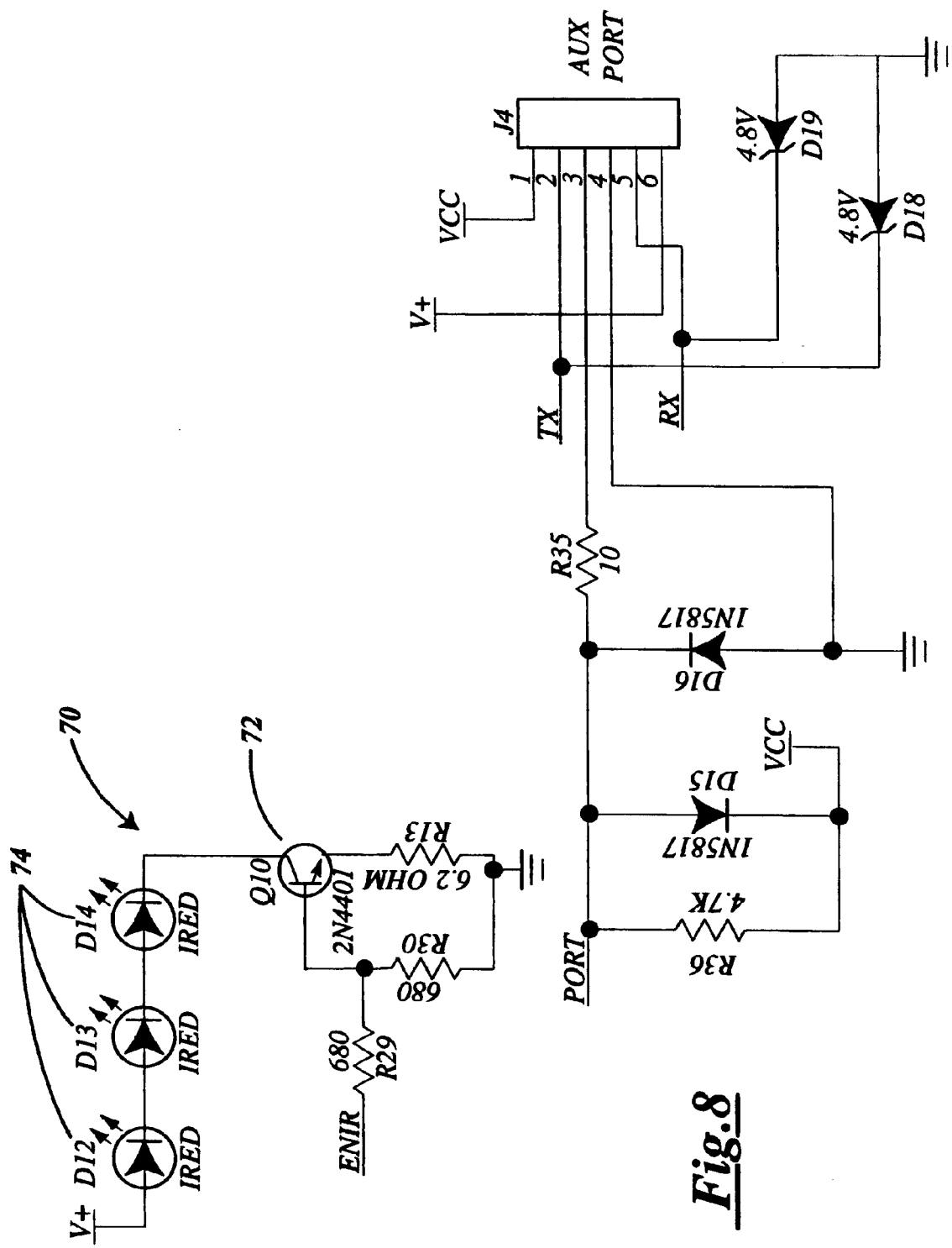
FIG. 7 is a schematic diagram of the infrared transmitter of the microterminal shown in FIG. 2.
FIG. 8 is a schematic diagram of the auxiliary port which can be used to communicate data to the controller of the microterminal shown in FIG. 2.

FIG. 5 shows the infrared receiver 50 of the microterminal. It includes three photo detectors 52, a transformer 54, and a differential amplifier 56 which compares the output of the transformer with a known value. Output from the infrared receiver is fed to an infrared demodulator 60 shown in 6. The output of the demodulator circuit is then fed into the microcontroller 40 via the microcontroller's input pin 12 (+RCV).

To achieve the desired advantages of the present invention, the microterminal 12 must also be used to transmit infrared signals. The microterminal 12, therefore, includes an infrared transmitter 70 (see FIG. 7). The transmitter 70 receives instructions from the microcontroller 40 via the microcontroller's pin 11 (ENIR). The ENIR signal from pin 11 opens or closes switch 72 to modulate the output of LEDs 74.

Figure 9:
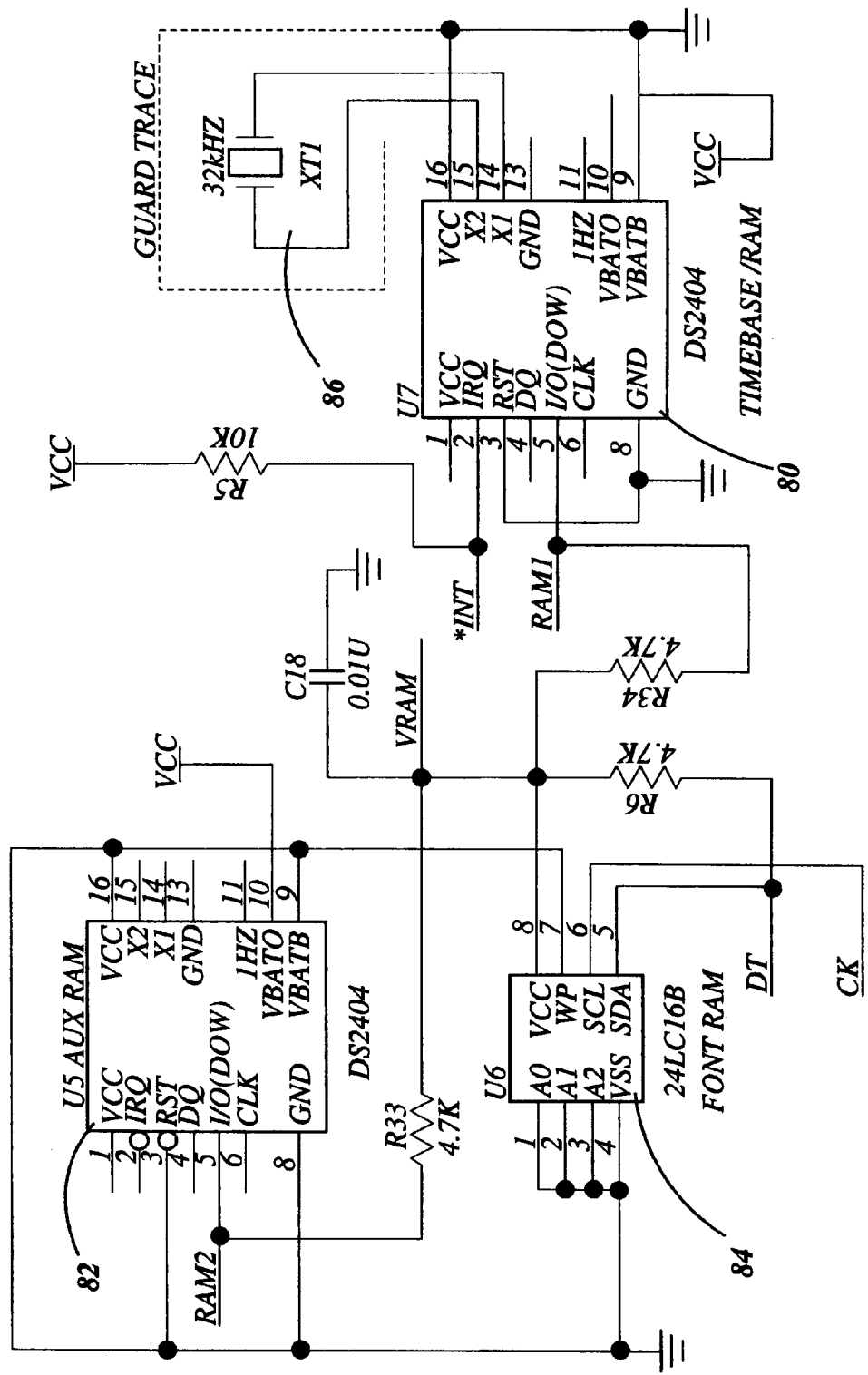
FIG. 9 is a schematic diagram of the auxiliary memory and timing circuit of the microterminal shown in FIG. 2.

In addition to the on-board memory of the microcontroller 40, the microterminal includes three other RAM memories 80, 82 and 84. These are shown in FIG. 9. Memory 80 is referred to as time base RAM because the information stored therein is principally used for timing and execution of the instructions contained in the firmware. Information is transmitted between RAM chip 80 and the microcontroller 40 via the microcontroller's pin 30 (RAM1). The auxiliary RAM chip 82 is provided to store messages to be displayed and the like. RAM chip 82 communicates with the microcontroller 40 via the microcontroller's pin 29 (RAM2). The primary function of RAM memory 84 is to store font information for display purposes. It communicates with the microcontroller 40 via the microcontroller's pins 37 (CK) and 40 (DT).

The beeper 30 is also controlled by the microcontroller 40. Pin 14 (Beep) of the microcontroller 40 is used to send control signals to the beeper causing it to sound. See FIG. 10.

Figure 11:
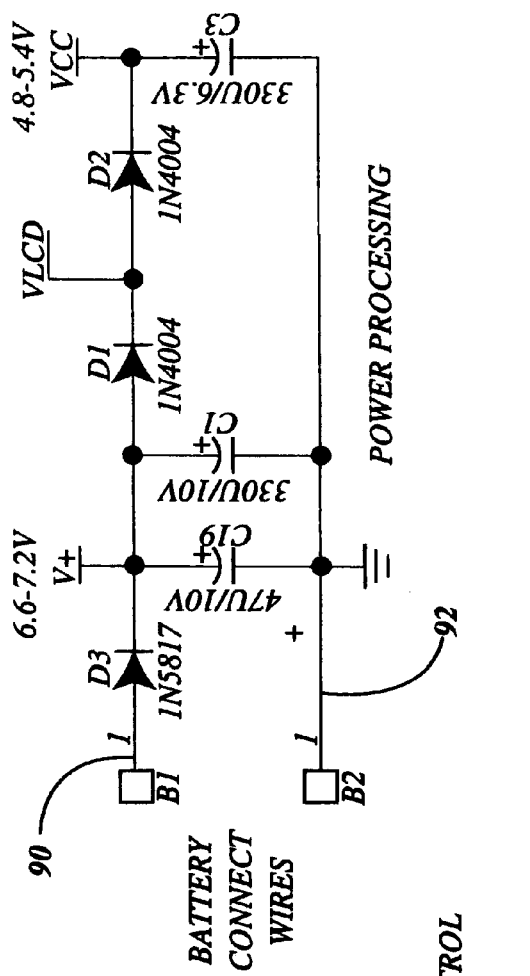
FIG. 11 is a schematic diagram of the power processing circuit of the microterminal shown in FIG. 2.
Figure 10:
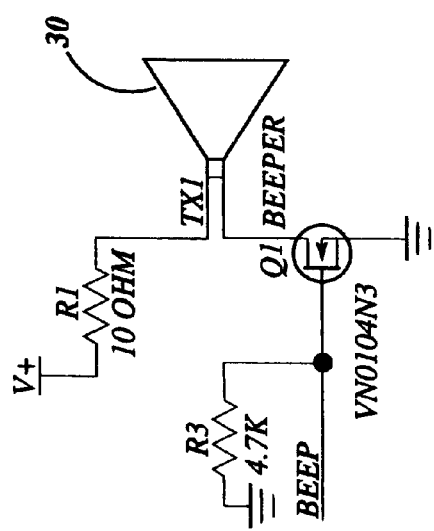
FIG. 10 is a schematic diagram of the circuit used by the controller of the microterminal to generate audible signals.
Figure 12:
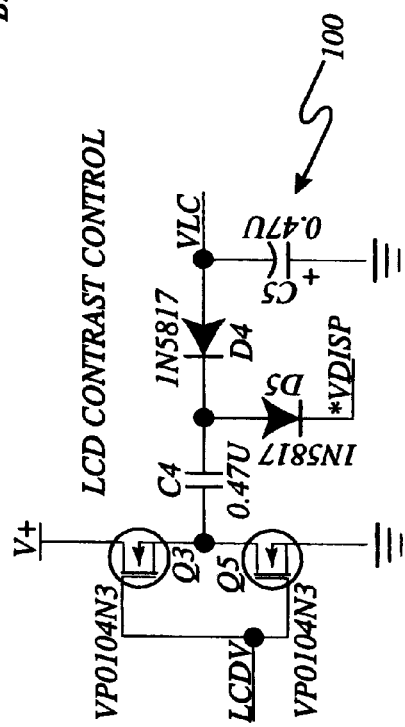
FIG. 12 is a schematic diagram of the circuit used to control the contrast of the LCD display of the microterminal shown in FIG. 2.
Figure 13:
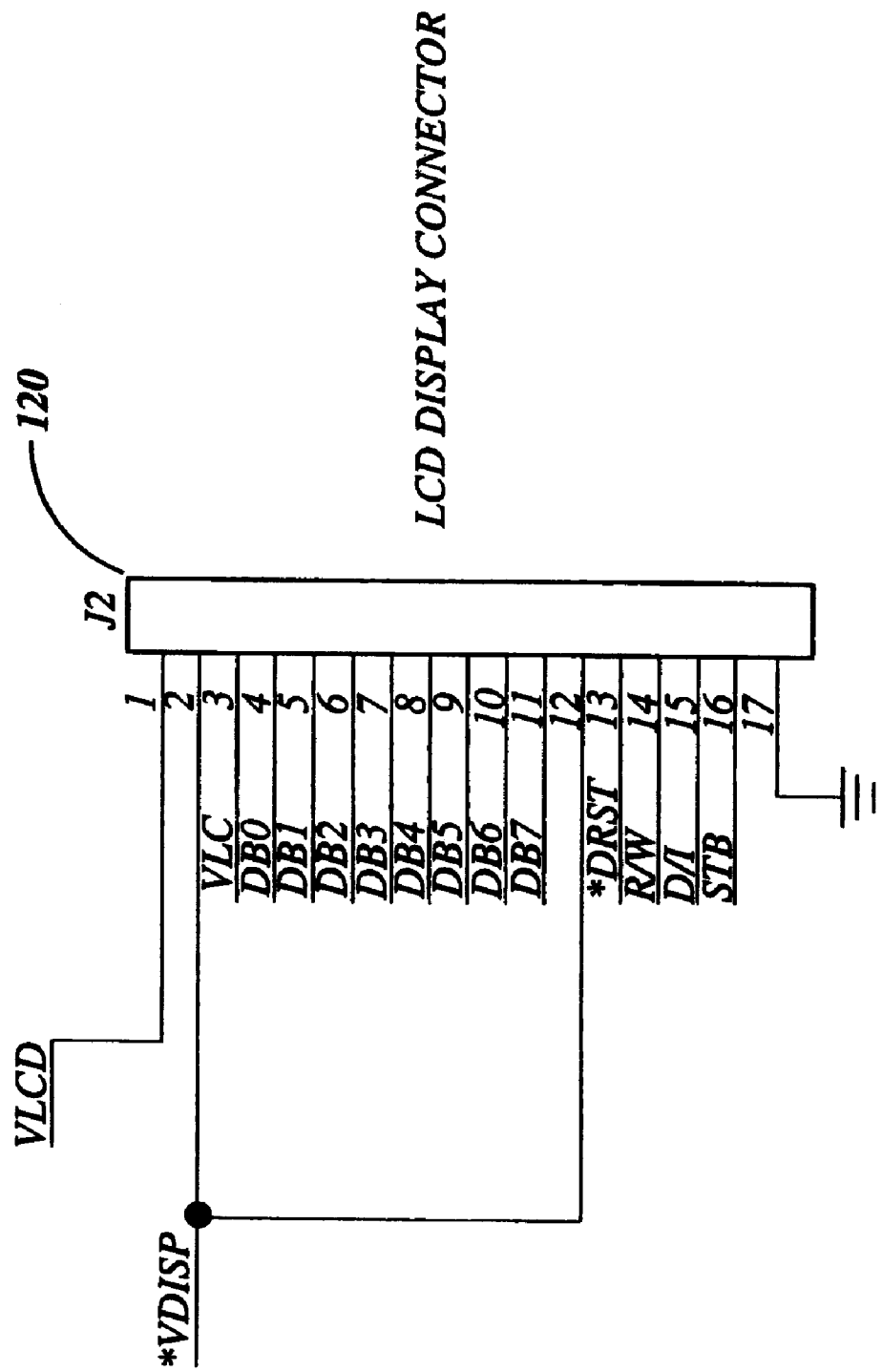
FIG. 13 is a schematic diagram of the LCD display connection of the microterminal shown in FIG. 2.

Power processing of the microterminal 12 is handled by the circuit shown in FIG. 11. The power processing circuit 90 includes a pair of battery connect wires 90 and 92 and is used to power the LCD display 20, the microcontroller 40, as well as the remaining components of the microterminal. The contrast of the LCD display 20 is controlled by the circuit 100 shown in FIG. 12.

The display 20 is connected to the microcontroller 20, the LCD contrast control circuit 100 and the power processing circuit 90. This is all done through jack 120 shown in FIG. 13. More specifically, the jack 120 is connected to pins 2–9 (DB0–DB7), 24 (VDISP), 33 (DRST), 36 (R/W), 38 (STB) and 39 (D/I) of microcontroller 40. Pin 3 of jack 120 is connected to the output of LCD contrast control circuit 100 shown in FIG. 12 and power is provided to the display via output VLCD of the power processing circuit 90 shown in FIG. 11.

The display 20 was specifically chosen to reduce energy consumption. Hence, it is a liquid crystal 32 row by 128 column display. It is capable of displaying 21 characters per line. The display 20 has its own volatile read/write memory and also has a non-volatile serial read/write memory to hold data necessary to translate character codes into display-ready font images. This display also holds some graphic images as well as a variety of text messages which can be displayed. Finally, the display 20 contains a voltage inverter system driven by the microcontroller 40 to generate negative voltage potentials required to activate the LCD pixels.

The IR receiver 50 of the microterminal 20 uses high speed infrared technology to detect and decode 447 kilohertz modulated IR signals at 880 nanometer wavelengths. The conical acceptance angle of the IR receiver is 80° from vertical. The IR receiver is surrounded by a cover 32 that is 95% transparent to IR energy at 880 nanometer wavelengths. Given this configuration, the IR receiver has a range of approximately 20 feet.

The microterminal's IR transmitter 70 is a current mode, high speed, high efficiency, 880 nanometer IR transmitter. The transmitter is pulse modulated at 447 kilohertz by serial data encoded in the pulse position modulation (PPM) format. The transmitter has an 80° radiation angle and generates light energy using three semi-conductor devices 74.

The user input system of the microterminal includes four switches 22, 24, 26 and 28. Each of the four switches are momentary contact, conductive rubber push button switches. Each is able to signal the microterminal 20 to generate messages which are then sent to the IRTs 9 through the infrared transmitter 70 of the microterminal 12. The microterminal 12 provides an audible chirp through beeper 30 with each button press. This chirp is generated by the microcontroller 40 and, thus, provides positive user feedback that the signal has been sent.

The power management system (See FIG. 11) of the microcontroller 40 includes two lithium thionyl chloride batteries in an AA cell Form Factor. Each cell has the capacity of 2100 milliampere-hours at nominally 3.6 volts. The power management system includes circuit protection against a reversal as well as power filtering and power conditioning. The microcontroller 40 of the microterminal 12 is capable of monitoring battery status so that low battery conditions can be reported to both the display 20 and the factory's central control computer 2. While the batteries of the microterminal 12 are not rechargeable, they are replaceable.

The microterminal 12 includes a unique timing system which is specifically designed to extend battery life. The timing system, which will be described in further detail below, causes the main processing unit to enter a power-down sleep mode for extended periods of time. The timing system includes a 32,768 hertz ceramic resonator 86 (see FIG. 9) which activates the microcontroller 40 of the microterminal at pre-defined intervals for routine processing.

The self-test subsystem of the microterminal performs basic memory and data checks on power up. It also uses the display 20 to report error conditions. If the display 20 is not operable, a series of beeps can be generated using beeper 30 to report errors. For example, the microterminal 12 will generate two beeps if the first RAM memory 80 is not responding. Three beeps are reported if the first RAM 80 is not returning correct data. If four or five beeps are generated, this is an indication that there is a problem with the second RAM memory 82. Four beeps means that the RAM is not responding at all. Five beeps means that the RAM is not returning correct data. Finally, six beeps indicates a failure in the font RAM 84.

As suggested above, the operation of the microterminal 12 is controlled by firmware placed in the microterminal's microcontroller 40 at the time the microterminal 12 is manufactured. General parameters related to operation of the microterminal 12 will now be described.

Each microterminal 12 is provided with a unique ID number that is stored in non-volatile memory. The ID number is used to uniquely identify the microterminal, to selectively direct data from the system controller 6 to the microterminal 12, to determine the microterminal's location, and is used by the system controller 6 to determine the source of data received from the microterminal. In the preferred embodiment, these identification numbers are 16 bit allowing 65,535 unique ID numbers to exist in a single system. The microterminals 12 also have a site code which is used to differentiate microterminals among 256 distinct sites or subsystems, providing 16 million unique microterminal designations.

The location of the microterminals 12 can be effectively tracked because each room or distinct area within the factory is equipped with its own IRT 9. The IRTs 9 are designed to send out beacons which contain a unique ID number. The microterminals 12 use the IRT's ID number in the beacon to determine whether the microterminal 12 has been physically moved since it received the last beacon. When the microterminal 12 determines that it has changed locations, it reports to the central control system that it has moved to a new location through an infrared transmission to the IRT 9. Reports by the microterminals 12 are continued in randomized fashion until the central control system acknowledges receipt of the location report. The maximum rate for the location reports is typically once every four seconds for each microterminal.

In addition to the ability of a microterminal 12 to communicate with the system controller 6 through the IRTs 9, each microterminal 12 is also capable of communicating with another microterminal. Thus, the factory can be equipped with a plurality of pairs of containers 100. As shown in FIG. 14, each pair 100 comprises an inner container such as a wafer carrier 102 and an outer container such as a WIP box 104. The factory can also be equipped with a plurality of pairs of microterminals, each pair of microterminals comprising a microterminal 12 attached to the inner container (wafer carrier) of a pair and a second microterminal 12 attached to the outer container (WIP box) of the pair. As indicated above, each microterminal 12 has a programmable processor (microcontroller 40) having a plurality of memory locations. One memory location, typically located in the non-volatile memory of the unit, is used to store an identification code for that microterminal 12. A second memory location (such as in RAM memories 80, 82 or 84 or the onboard memory of the microcontroller 40) can be used to store an identification code for the second microterminal 12 of the pair of microterminals. With such information stored in memory and with the ability for two-way communication between any two microterminals, the microterminals can communicate with each other to determine whether the inner container 102 of a pair of containers is within the outer container 104 of the pair.

A significant advantage of this embodiment is derived from the fact that each of the microterminals 12 includes a beeper 30 and a display 20. The program of the microterminal 12 can cause this beeper 30 to be used to issue an audible alarm which is activated if an inner container 102 not paired with the outer container 104 is placed within the outer container 104. The program can also cause display 20 to provide a visual alarm. Further, because the apparatus includes a plurality of IRTs, each comprising a transceiver positioned in a separate zone of the workplace and coupled to a central controller for two-way communication between the IRTs and the central controller, there can also be two-way communication between the microterminals 12 and the central controller via the IRTs. This two-way communication permits the microterminals to send messages to the central controller via the IRTs in the event an inner container 102 not paired with the outer container 104 is positioned within said outer container 104. Such messages can be in the form of an alarm code indicating a mismatch. Alternatively, the signal can include the identity of the inner and outer containers 102 and 104 which are mismatched so that this information is available to the central controller. This capability is schematically represented in FIG. 15.

It is also important to note that two-way communication between the central controller and microterminal 12 via the IRTs permits programming messages to be sent from the central controller to the microterminals 12. Likewise, the central controller can interrogate the microterminals 12 in a particular zone to ascertain the identity of the containers in said zone. Further, the microterminals can be reprogrammed based upon instructions received from the central controller via the IRTs.

In any system that relies upon battery powered units, it is important to conserve battery life. Thus, there are advantages in minimizing communication between the two microterminals 12 attached to a pair of inner and outer containers. One approach for doing so is for the two microterminals 12 of a pair to only communicate with each other when there is a detection that the outer container 104 has been closed around the inner container 102. For example, the motion sensor 44 of the microterminal 12 can be used to detect such a box closure and trigger the microterminal 12 to commence to a communication. Likewise, the microterminal 12 can be equipped with a light sensor which causes the microterminal 12 to be activated and commence communication when there is insufficient light. This is particularly useful in connection with microterminals 12 attached to the inner container when the outer container is opaque.

Of course, those skilled in the art will readily understand that there are less expensive means available for identifying a container than use of a microterminal 12 of the type outlined above. For example, a container could be labeled with a machine readable message bearing an identification code. If one container of the pair is labeled in this fashion and the other container is equipped with a microterminal 12 capable of reading this code, then all processing required to determine proper matching of pairs (or to send an alert in the event of a mismatch of pairs of inner and outer containers) can be accomplished using a single microterminal 12.

In most instances, it is anticipated that such a microterminal 12 would be positioned on the outer container 104 and would read such a label positioned on the inner container 102. However, the microterminal 12 can be placed on the inner container 102 if the outer container 104 is designed so that it is transparent to or does not unduly interfere with signals transmitted between the IRTs and microterminal 12. Machine-readable codes are well known in the art. One common example is a bar code. When a bar code is used, the microterminal 12 would thus need to be equipped with a bar code reader.

Still another embodiment of the present invention would include the use of a microterminal 12 on one of the containers and an electronic tag on the other container. Such an electronic tag might be what is referred to in the art as a "dumb tag". Such tags are generally not programmable and have no processing means. However, such tags are capable of transmitting an identification code when interrogated. The transmission signal incorporating the code could be in the form of light pulses, magnetic pulses, R.F. waves or the like. Of course, when such a "dumb tag" is used, the microterminal would need to be equipped with a receiver capable of reading the identification code transmitted by the dumb tag.

Those skilled in the art will appreciate the significant advantages provided by this system in a wide variety of manufacturing environments. Although the invention has been described with reference to certain specific embodiments contemplated for use, the manufacture of semiconductors in an environment which uses wafer carriers and WIP boxes, this description is not meant to be construed in a limiting sense. Modifications of the embodiments disclosed herein, alternative uses, as well as alternative embodiments will be apparent to a person skilled in the art after a reading of the disclosure set forth above. It is, therefore, contemplated that the claims as set forth below will cover all embodiments and uses of those embodiments falling within the scope of the invention as defined by the claims.

It is claimed:

1. An apparatus for tracking items in a work place, said apparatus comprising:
   (a) a set of inner containers;
   (b) a plurality of first tracking devices, each inner container of said set of inner containers having one of said first tracking devices attached to it, each of said first tracking devices having a unique identification code to identify the inner container to which the first tracking device is attached;
   (c) a set of outer containers;
   (d) a plurality of second tracking devices, each outer container of said set of outer containers having a second tracking device attached to it, each of said second tracking devices having means for accessing the identification code of the first tracking device attached to an inner container located within said outer container and having a microcontroller for processing a identification code to determine whether a proper inner container is located within said outer container; at least one of said second tracking devices having an audible alarm which is activated if an inner container other than the proper inner container is located within the outer container.

2. The apparatus of claim 1 wherein said first tracking device is a label and the unique identification code is a machine readable code.

3. The apparatus of claim 2 wherein said machine readable code is a bar code.

4. The apparatus of claim 3 wherein said means for accessing the identification code of the first tracking device is a bar code reader.

5. The apparatus of claim 1 wherein at least one of said first tracking devices further includes a transmitter for transmitting an identification signal containing the unique identification code of said first tracking device.

6. The apparatus of claim 5 wherein the means for reading the identification code of said first tracking device comprises a receiver on the second tracking device which receives the identification signal containing the unique identification code transmitted by the transmitter of a first tracking device.

7. The apparatus of claim 5 wherein said identification signal is transmitted in response to an interrogation signal.

8. The apparatus of claim 7 wherein said second tracking device further includes a transmitter which transmits an interrogation signal.

9. The apparatus of claim 1 wherein said alarm is a visual alarm which is activated if an inner container other than the proper inner container is located within the outer container.

10. The apparatus of claim 1 wherein said second tracking device further includes a visual alarm which is also activated if an inner container other than the proper inner container is located within the outer container.

11. The apparatus of claim 1 further including a central controller.

12. The apparatus of claim 11 further including a plurality of first transceivers, each of said transceivers coupled to said central controller for two-way communication between the central controller and said transceivers, said transceivers strategically positioned throughout the work place.

13. The apparatus of claim 12 wherein at least one of said second tracking devices include a second transceiver for two-way communication with said first transceivers.

14. The apparatus of claim 13 wherein said second transceiver of a second tracking device and at least one of said first transceivers cooperate to indicate to the central controller the identity of an inner container located within the outer container to which said second tracking device is attached.

15. The apparatus of claim 1 wherein said microcontroller of the second tracking device is programmable to change which of said inner containers is the proper inner container to be located within said outer container.

16. The apparatus of claim 13 wherein said microcontroller of said second tracking device is reprogrammable based upon instructions received from the central controller via at least one of said first transceivers and the second transceiver of the second tracking device.

17. An apparatus for tracking items in a work place, said apparatus comprising:
   (a) a set of outer containers;
   (b) a plurality of labels, each outer container of said set of outer containers having one of said labels attached to it, each of said labels having a bar code to identify the outer container to which the label is attached;
   (c) a set of inner containers;
   (d) a plurality of second tracking devices, each inner container of said set of inner containers having a second tracking device attached to it, each of said second tracking devices having means for accessing the bar code of the label attached to an outer container within which said inner container is located and microcontroller for processing the bar code to determine whether said inner container is located within a proper outer container.

18. The apparatus of claim 17 wherein said means for accessing the bar code of the label is a bar code reader.

19. The apparatus of claim 17 further including a central controller.

20. The apparatus of claim 19 further including a plurality of first transceivers, each of said transceivers coupled to said central controller for two-way communication between the central controller and said transceivers, said transceivers strategically positioned throughout the work place.

21. The apparatus of claim 20 wherein at least one of said second tracking devices include a second transceiver for two-way communication with said first transceivers.

22. The apparatus of claim 21 wherein said second transceiver of a second tracking device and at least one of said first transceivers cooperate to indicate to the central controller the identity of a pair of containers comprising an inner container located within an outer container.

23. The apparatus of claim 17 wherein said microcontroller of the second tracking device is programmable to change which of said inner containers is the inner container to be located within the proper outer container.

24. The apparatus of claim 21 wherein said microcontroller of said second tracking device is reprogrammable based upon instructions received from the central controller via at least one of said first transceivers and the second transceiver of the second tracking device.

25. An apparatus for tracking items in a work place, said apparatus comprising:
 (a) a set of outer containers;
 (b) a plurality of first tracking devices, each outer container of said set of outer containers having one of said first tracking devices attached to it, each of said first tracking devices having a unique identification code to identify the outer container to which the first tracking device is attached;
 (c) a set of inner containers;
 (d) a plurality of second tracking devices wherein at least one of said second tracking devices includes an alarm, and each inner container of said set of inner containers having a second tracking device attached to it, each of said second tracking devices having means for accessing the identification code of the first tracking device attached to an outer container within which said inner container is located and a microcontroller for processing the identification code to determine whether said inner container is located within a proper outer container.

26. The apparatus of claim 25 wherein said alarm is an audible alarm which is activated if an inner container is located within the outer container other than the proper outer container.

27. The apparatus of claim 25 wherein said alarm is a visual alarm which is activated if an inner container is located within the outer container other than the proper outer container.

28. The apparatus of claim 26 wherein said second tracking device further includes a visual alarm which is also activated if an inner container is located within the outer container other than the proper outer container.

* * * * *